United States Patent
Tao et al.

(10) Patent No.: US 10,896,981 B1
(45) Date of Patent: Jan. 19, 2021

(54) INTEGRATION OF VERTICAL GAN VARACTOR WITH HEMT

(71) Applicant: QUALCOMM Incorporated, San Diego, CA (US)

(72) Inventors: Gengming Tao, San Diego, CA (US); Xia Li, San Diego, CA (US); Bin Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/511,093

(22) Filed: Jul. 15, 2019

(51) Int. Cl.
*H01L 29/93* (2006.01)
*H01L 29/66* (2006.01)
*H01L 29/778* (2006.01)

(52) U.S. Cl.
CPC ........ *H01L 29/93* (2013.01); *H01L 29/66174* (2013.01); *H01L 29/66431* (2013.01); *H01L 29/778* (2013.01)

(58) Field of Classification Search
None
See application file for complete search history.

(56) References Cited

U.S. PATENT DOCUMENTS

| | | | | |
|---|---|---|---|---|
| 5,705,847 A | * | 1/1998 | Kashiwa | H01L 21/8252 257/471 |
| 2014/0110761 A1 | | 4/2014 | Yang et al. | |
| 2014/0117411 A1 | * | 5/2014 | Kanaya | H01L 27/0605 257/195 |
| 2017/0170233 A1 | * | 6/2017 | Tsai | H01L 29/93 |
| 2018/0337271 A1 | | 11/2018 | Kotani et al. | |

FOREIGN PATENT DOCUMENTS

JP   2002026253 A   1/2002

OTHER PUBLICATIONS

S. Preis, F. Lenze, A. Wiens, R. Jakoby, W. Heinrich and O. Bengtsson, "Reconfigurable packaged GaN power amplifier using thin-film BST varactors," 2017 47th European Microwave Conference (EuMC), Nuremberg, 2017, pp. 140-143, doi: 10.23919/EuMC.2017.8230819 (Year: 2017).*

C. Kong, H. Li, S. Jiang, J. Zhou, X. Chen and C. Chen, "A monolithic AlGaN/GaN HEMT VCO using BST film varactor," 2011 IEEE International Symposium on Radio-Frequency Integration Technology, Beijing, 2011, pp. 197-200, doi: 10.1109/RFIT.2011.6141794. (Year: 2011).*

(Continued)

*Primary Examiner* — J. E. Schoenholtz
(74) *Attorney, Agent, or Firm* — Withrow & Terranova, PLLC

(57) ABSTRACT

Aspects generally relate to a P-N junction varactor that can be integrated with high electron mobility transistor (HEMT) in a single device or die. The varactor and HEMT are fabricated with the same materials forming various layers of the varactor and HEMT. Using the same material stack-up to form the varactor and HEMT can reduce the number of processing steps during the fabrication of the integrated varactor and HEMT device. The integrated varactor and HEMT device may be used for RF circuits, such as radio frequency front end (RFFE) devices for use in 5G.

25 Claims, 14 Drawing Sheets

(56) References Cited

OTHER PUBLICATIONS

Jahan F., et al., "RF power limiter using capacitively-coupled contacts III-nitride varactor," Electronics Letters, Nov. 8, 2012, vol. 48, No. 23, 2 pages.
Mutamba K., et al., "Technology of Wide-Bandgap Diode Structures for Highfrequency Operation," International Semiconductor Conference, IEEE, 2006, pp. 85-92.
Kong C., et al., "A Monolithic AlGaN/GaN HEMT VCO Using BST Thin-Film Varactor," in IEEE Transactions on Microwave Theory and Techniques, vol. 60, No. 11, pp. 3413-3419, Nov. 2012, DOI: 10.1109/TMTT.2012.2209442, 2012, pp. 3413-3419.
Marso M., et al., "AlGaN/GaN Varactor Diode for Integration in HEMT Circuits," in Electronics Letters, vol. 37, No. 24, pp. 1476-1478, Nov. 22, 2001, DOI: 10.1049/el:20011007, 2001.
Amirpour R., et al., "Dynamic Load Modulated Low-Voltage GaN PA Using Novel Low-Loss GaN Varactors", 2018 48th European Microwave Conference (EUMC), European Microwave Association, Sep. 25-27, 2018, Madrid, Spain, Sep. 23, 2018 (Sep. 23, 2018), XP033450434, pp. 5-8, DOI: 10.23919/EUMC.2018.8541639 [retrieved on Nov. 20, 2018], Sections I, III, Figure 5.
Hamdoun A., et al., "Characterization of GaN-Based HEMTs as Varactor Diode Devices", 2015 10th European Microwave Integrated Circuits Conference (EUMIC), EUMVA, Sep. 7-8, 2015, Paris, France, Sep. 7, 2015 (Sep. 7, 2015), XP032823276, pp. 417-420, DOI:10.1109/EUMIC.2015.7345158 [retrieved on Dec. 2, 2015], Section VII.
International Search Report and Written Opinion for International Patent Application No. PCT/US2020/070088, dated Sep. 30, 2020, 19 pages.
Mahaboob I., et al., "Dynamic Control of AlGaN/GaN HEMT Characteristics by Implementation of a p-GaN Body-Diode-Based Back-Gate", IEEE Journal of the Electron Devices Society, Vol. 7, May 24, 2019 (May 24, 2019), XP011726901, pp. 581-588, DOI: 10.1109/JEDS.2019.2915097 [retrieved on May 23, 2019], Sections II, III.A. IV, Figures 1, 4.
Marso M., et al., "Comparison of AlGaN/GaN MSM Varactor Diodes Based on HFET and MOSHFET Layer Structures", Annual India Conference, 2006, IEEE, PI, Oct. 2006 (Oct. 2006), XP031062279, pp. 229-232, DOI: 10.1109/ASDAM.2006.331195, ISBN: 978-1-4244-0369-1, Section "1. Introduction", Figure 1.
Xu H. et al., "Integration of $Ba_xSr_{1-x}TiO_3$ Thin Films with AlGaN/GaN HEMT Circuits", IEEE Electron Device Letters, IEEE, Vol. 25, No. 2, Feb. 2004 (Feb. 2004), XP011106285, pp. 49-51, ISSN: 0741-3106, DOI:10.1109/LED.2003.822672, Sections 1, 4, Figure 1.

\* cited by examiner

INTEGRATION OF VERTICAL GAN VARACTOR WITH HEMT

BACKGROUND

I. Field of the Disclosure

Aspects of the disclosure relate generally to integrated circuits, and in particular, to integration of vertical GaN varactors with high electron mobility transistors (HEMT).

II. Background

As mobile devices, such as smart phones, continue to evolve, the need for improved radio frequency (RF) performance increases. For example, as wireless technology migrates from third generation (3G), to fourth generation (4G) or long term evolution (LTE), to fifth generation (5G), RF requirements continue to become more demanding due to having to support wider bandwidths and higher frequency bands, such as sub 6 GHz and millimeter wave signals.

RF components in mobile devices include RF front end (RFFE) circuits can include power amplifiers and filters that are separate compounds. Modern RFFE components typically include III-V type devices, such as GaN high electron mobility transistors (HEMT). RFFE components also typically include capacitive tuning circuits, such as varactors, to provide filtering and matching circuitry for power amplifiers.

It would be beneficial to more tightly integrate HEMT devices with varactors.

SUMMARY OF THE DISCLOSURE

The described aspects generally relate to integrating varactors and high electron mobility transistors (HEMT) in a single device or die.

Aspects include an integrated circuit including a varactor and a high electron mobility transistor (HEMT). The varactor and HEMT are fabricated with the same layers formed in the integrated circuit. In the following description, when a substance has been lightly doped with an N dopant the chemical compound is proceeded with a $N^-$, when a substance has been heavily doped with a N dopant the chemical compound is preceded with the notation $N^+$, and when a substance has been doped with an N dopant to a normal, or average level, the chemical compound is preceded with the notation N. Likewise, when a substance has been lightly doped with an P dopant the chemical compound is proceeded with a $P^-$, when a substance has been heavily doped with a P dopant the chemical compound is preceded with the notation $P^+$ and when a substance has been doped with an P dopant to a normal, or average level, the chemical compound is preceded with the notation P. In the following description, when an element in a chemical formula is listed in parenthesis, ( ), it indicates that the amount of that element in the compound can be varied, or the element can be removed, and still be within the scope of the present disclosure.

An aspect of an integrated circuit includes a substrate, and a buffer layer on the substrate. A first $P^+$ gallium nitride (GaN) layer is on a first portion of the buffer layer and a second $P^+$ GaN layer on a second portion of the buffer layer, the first $P^+$ GaN layer is electrically isolated from the second $P^+$ GaN layer. A first $N^-$ GaN layer is on the first $P^+$ GaN layer and a second $N^-$ GaN layer is on a portion of the second $P^+$ GaN layer, the first $N^-$ GaN layer electrically isolated from the second $N^-$ GaN layer. A first N-aluminum gallium nitride (AlGaN) layer is on the first N GaN layer and a second $N^-$ AlGaN layer is on the second $N^-$ GaN layer, the first $N^-$ AlGaN layer electrically isolated from the second $N^-$ AlGaN layer. A first contact is coupled to a portion of the second $P^+$ GaN layer, the first contact electrically isolated from the second $N^-$ GaN layer, a second contact is coupled to the second $N^-$ AlGaN layer, a third contact is coupled to a first portion of the first $N^-$ layer, a fourth contact is coupled to a second portion of the first $N^-$ AlGaN layer and a fifth contact is coupled to a third portion of the first $N^-$ AlGaN layer, the fourth contact is located between the third and fifth contact, the third, fourth, and fifth contact electrically isolated from each other.

The integrated circuit can also include the first $N^-$ GaN layer and the second $N^-$ GaN layer having non-uniform doping profiles. Also, a first $P^-$ GaN layer can be between the first $P^+$ GaN layer and the first $N^-$ GaN layer, and a second $P^-$ GaN layer can be between the second $P^+$ GaN layer and the second $N^-$ GaN layer. In an aspect, a first N InGaN layer can be between the first $N^-$ AlGaN layer and the third, fourth, and fifth contacts; and a second N indium gallium nitride (InGaN) layer can be between the second $N^-$ AlGaN layer and the second contact. The first and second $N^-$ AlGaN layers can also include In.

In another aspect, an integrated circuit including a varactor and a high electron mobility transistor (HEMT) can include a substrate and a buffer layer on the substrate. A $P^+$ GaN layer on the buffer layer, a $N^-$ GaN layer, having a non-uniform doping profile, on a portion of the $P^+$ GaN layer, and a $N^-$ AlGaN layer on the $N^-$ GaN layer having a non-uniform doping profile. A first contact is coupled to a portion of the first $P^+$ GaN layer, the first contact electrically isolated from the $N^-$ GaN layer having a non-uniform doping profile. A second contact is coupled to a first portion of the $N^-$ AlGaN layer. A third contact is coupled to a second portion of the $N^-$ AlGaN layer. A fourth contact is coupled to a third portion of the $N^-$ AlGaN layer. The fourth contact is located between the second and third contacts, the second, third, and fourth contacts electrically isolated from each other.

In another aspect, an integrated circuit can include a varactor. The varactor includes a $P^+$ GaN layer, and a $N^-$ GaN layer on the $P^+$ GaN layer, and a $N^-$ AlGaN layer on the $P^+$ GaN layer. The varactor includes a first contact coupled to the $P^+$ GaN layer and a second contact coupled to the $N^-$ AlGaN layer. The integrated circuit also includes a high electron mobility transistor (HEMT). The HEMT includes a $P^+$ GaN layer coplanar with the $P^+$ GaN layer of the varactor, a $N^-$ GaN layer on the $P^+$ GaN layer, the $N^-$ GaN layer coplanar with the $N^-$ GaN layer of the varactor, and a $N^-$ AlGaN layer on the $P^+$ GaN layer, the $N^-$ AlGaN layer coplanar with the $N^-$ AlGaN layer of the varactor. The HEMT also includes a third contact, a fourth contact, and a fifth contact coupled to the $N^-$ AlGaN layer, the third, fourth, and fifth contacts electrically isolated from each other and the fourth contact between the third and fifth contacts.

The integrated circuit can also include the $N^-$ GaN layers having non-uniform doping profiles. The integrated circuit can also have the varactor include a $P^-$ GaN layer between the $P^+$ GaN layer and the $N^-$ GaN layer; and the HEMT include a $P^-$ GaN layer between the $P^+$ GaN layer and the $N^-$ GaN layer. The varactor $P^-$ GaN layer and the HEMT $P^-$ GaN layers being co-planar. The integrated circuit can also have the HEMT include a N InGaN layer between the $N^-$ AlGaN layer and the third, fourth, and fifth contacts and the varactor can include a N InGaN layer between the $N^-$ AlGaN layer and the second contact. The HEMT N InGaN layer and the varactor N InGaN layers being co-planar.

In another aspect, an RF module, such as an RF power amplifier, can include a HEMT configured to receive an RF signal and output an amplified RF signal, and a varactor configured to couple the amplified RF signal to a load. The HEMT and varactor being integrated in the same die. The RF module HEMT and varactor can include a substrate and a buffer layer on the substrate. A first P⁺ GaN layer on the buffer layer and a second P⁺ GaN layer on a first portion of second portion of the buffer layer, the first P⁺ GaN layer electrically isolated from the second P⁺ GaN layer. A first N⁻ GaN layer on a portion of the first P⁺ GaN layer and a second N⁻ GaN layer on the second P⁺ GaN layer, the first N⁻ GaN layer electrically isolated from the second N⁻ GaN layer. A first N⁻ AlGaN layer on the first N⁻ GaN layer and a second N⁻ AlGaN layer on the second N⁻ GaN layer, the first N⁻ AlGaN layer electrically isolated from the second N⁻ AlGaN layer. A first contact is coupled to a portion of the second P⁺ GaN layer, the first contact electrically isolated from the second N⁻ GaN layer, a second contact is coupled to the second N⁻ AlGaN layer, a third contact is coupled to a first portion of the first N⁻ AlGaN layer, a fourth contact coupled to a second portion of the first N⁻ AlGaN layer and a fifth contact is coupled to a third portion of the first N⁻ AlGaN layer. The fourth contact is located between the third and fifth contact, the third, fourth, and fifth contact electrically isolated from each other. In an aspect, the first N⁻ GaN layer and the second N⁻ GaN layer can have non-uniform doping profiles. The RF module HEMT and varactor can include a first P⁻ GaN layer between the first P⁺ GaN layer and the first N⁻ GaN layer, and a second P GaN layer between the second P⁺ GaN layer and the second N⁻ GaN layer. The RF module HEMT and varactor can also include a first N InGaN layer between the first N⁻ AlGaN layer and the third, fourth, and fifth contacts and a second N InGaN layer between the second N⁻ AlGaN layer and the second contact. The first and second N⁻ AlGaN layers can include In. The RF module can be an RF power amplifier that transmits RF signals, such as 5G RF signals.

In another aspect, an RF module, such as an RF power amplifier, the HEMT and varactor include a substrate, a buffer layer on the substrate, a P⁺ GaN layer on the buffer layer, a N⁻ GaN layer, having a non-uniform doping profile, on a portion of the P⁺ GaN layer, and a N⁻ AlGaN layer on the N⁻ GaN layer having a non-uniform doping profile. There is also a first contact coupled to a portion of the first P⁺ GaN layer, the first contact electrically isolated from the N⁻ GaN layer having non-uniform doped profile, a second contact coupled to a first portion of the N⁻ AlGaN layer, a third contact coupled to a second portion of the N⁻ AlGaN layer, a fourth contact coupled to a third portion of the N⁻ AlGaN layer, the fourth contact located between the second and third contacts, the second, third, and fourth contacts electrically isolated from each other. The RF module can be an RF power amplifier that transmits RF signals, such as 5G RF signals.

Another aspect includes a method of manufacturing device with a varactor integrated with a HEMT. The method includes forming a substrate. Forming a buffer layer on the substrate. Forming a first P⁺ GaN layer on a first portion of the buffer layer and forming a second P⁺ GaN layer on a second portion of the buffer layer, the first P⁺ GaN layer electrically isolated from the second P⁺ GaN layer. Forming a first N⁻ GaN layer on the first P⁺ GaN layer and forming a second N⁻ GaN layer on a portion of the second P⁺ GaN layer, the first N⁻ GaN layer electrically isolated from the second N⁻ GaN layer. Forming a first N⁻ AlGaN layer on the first N⁻ GaN layer and forming a second N⁻ AlGaN layer on the second N⁻ GaN layer, the first N⁻ AlGaN layer electrically isolated from the second N⁻ AlGaN layer. Forming a first contact coupled to a portion of the second P⁺ GaN layer, the first contact electrically isolated from the second N⁻ GaN layer, forming a second contact coupled to the second N⁻ AlGaN layer, forming a third contact coupled to a first portion of the first N⁻ AlGaN layer, forming a fourth contact coupled to a second portion of the first N⁻ AlGaN layer and forming a fifth contact coupled to a third portion of the first N⁻ AlGaN layer, the fourth contact located between the third and fifth contact, the third, fourth, and fifth contact electrically isolated from each other.

The first N⁻ GaN layer and the second N⁻ GaN layer can have non-uniform doping profiles. The method can also include forming a first P⁻ GaN layer between the first P⁺ GaN layer and the first N⁻ GaN layer, and forming a second P⁻ GaN layer between the second P⁺ GaN layer and the second N⁻ GaN layer. The method can also include forming a first N InGaN layer between the first N⁻ AlGaN layer and the third, fourth, and fifth contacts, and forming a second N InGaN layer between the second N⁻ AlGaN layer and the second contact. The first and second N⁻ AlGaN layers can include In.

Another aspect includes a method of manufacturing a device with a varactor integrated with a HEMT. The method includes forming a substrate, forming a buffer layer on the substrate, forming a P⁺ GaN layer on the buffer layer, forming a N⁻ GaN layer, having a non-uniform doping profile, on a portion of the P⁺ GaN layer, and forming a N⁻ AlGaN layer on the N⁻ GaN layer having a non-uniform doping profile. Forming a first contact coupled to a portion of the P⁺ GaN layer, the first contact electrically isolated from the N⁻ GaN layer having a non-uniform doping profile, forming a second contact coupled to a first portion of the N⁻ AlGaN layer, forming a third contact coupled to a second portion of the N⁻ AlGaN layer, forming a fourth contact coupled to a third portion of the N⁻ AlGaN layer, the fourth contact located between the second and third contacts, the second, third, and fourth contacts electrically isolated from each other.

Various aspect and features of the disclosure are described in further detail below.

BRIEF DESCRIPTION OF THE FIGURES

The accompanying drawings are presented to aid in the description and illustrations of embodiments and are not intended to be limitations thereof.

The drawings may not depict all components of a particular apparatus, structure, or method. Further, like reference numerals denote like features throughout the specification and figures.

DETAILED DESCRIPTION

Figure 1:
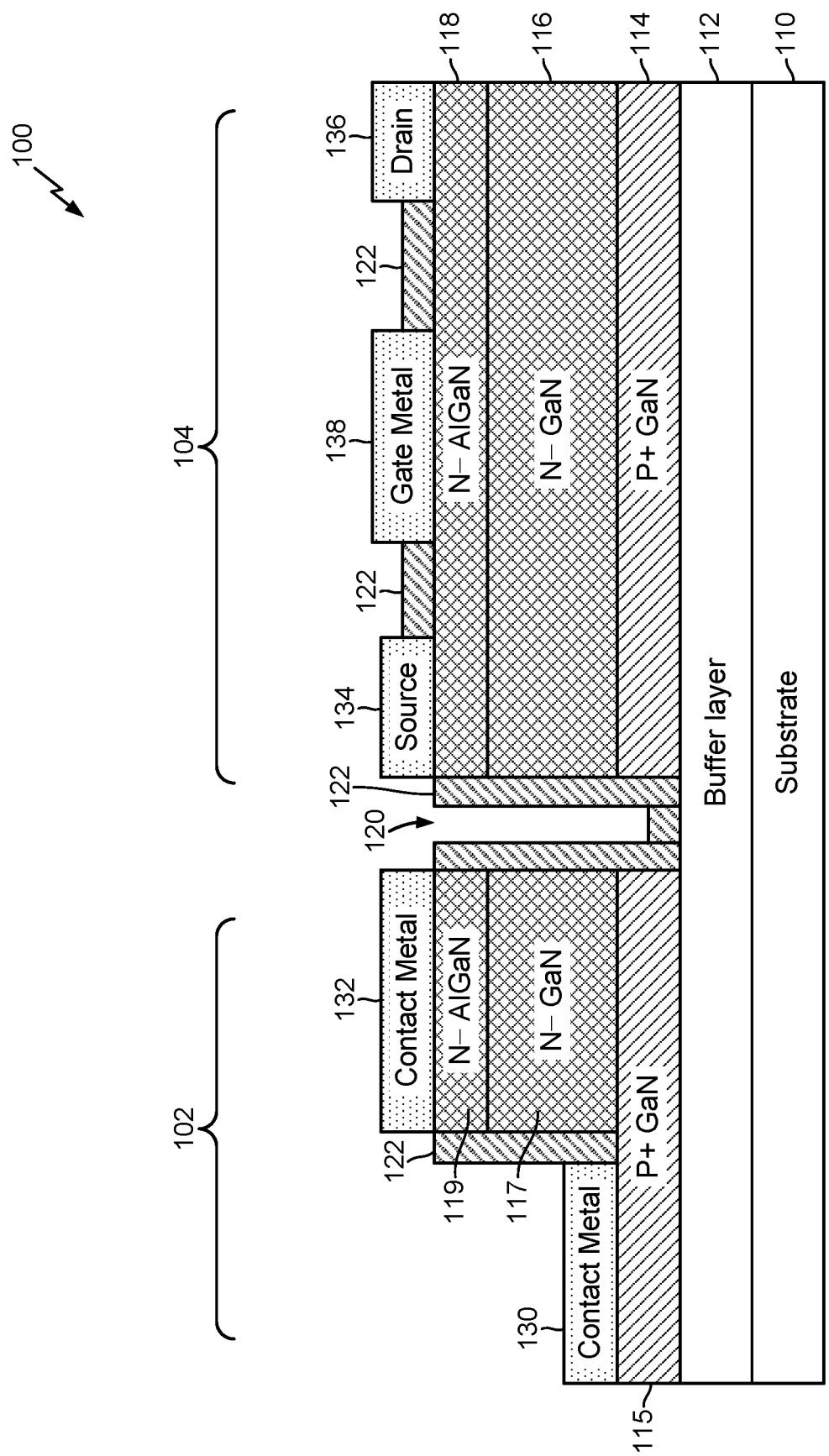
FIG. 1 is a diagram illustrating a vertical P-N junction varactor integrated with a HEMT in the same device.

Aspects disclosed in the following description and related drawings are directed to specific aspects. Alternatives may be devised without departing from the scope of the invention. Additionally, well-known elements may not be described in detail, or may be omitted, so as not to obscure relevant details. Examples disclosed may be suitably included in any electronic device.

With reference now to the drawing, several exemplary aspects of the present disclosure are described. The word "exemplary" is used herein to mean "serving as an example, instance, or illustration." Any aspect described herein as "exemplary" is not necessarily to be construed as preferred or advantageous over other aspects. Furthermore, the terminology used herein is for the purpose of describing particular embodiments and is not intended to be limiting Modern RF device, such as 5G devices, often include high electron mobility transistors (HEMT) to support the high frequency and high voltage of 5G RF signals. Gallium nitride (GaN) offers advantages over silicon (Si) and other I—V type materials due to its high electron peak velocity and high breakdown voltage. Thus, GaN is seeing increased use in 5G devices.

Typical RF devices, such as 5G devices, also include RF tuning circuits. For example, a 5G RF device may include a tuning circuit to match a power amplifier (PA) to an antenna, or a filter circuit that is tuned to a desired frequency. To accommodate different frequencies that are in a 5G signal, tuning circuits typically include capacitance tuning, such as a variable capacitor, or a varactor, that can be adjusted to accommodate a desired frequency, or frequency band, for a tuning device. With increased use of GaN HEMT in 5G devices it would be desirable to have a GaN varactor that can be integrated with a GaN HEMT in the same device or die. It would also be desirable for the GaN varactor to be able to have a wide tuning range and high breakdown voltage to support wideband, high power, 5G RF signals.

Current GaN varactors suffer from some limitations. For example, lateral GaN varactors typically have relatively small tuning range and low breakdown voltage. These characteristics make lateral varactors less desirable for 5G RF devices to support the very wideband and high-power requirements of 5G signals. Another type of GaN varactor is a Schottky junction varactor, but these varactors suffer from large leakage current, thereby consuming large amounts of power making them undesirable for use in battery operated devices, such as mobile devices. Another type of varactor is a vertical $N^-N$ junction GaN varactor. Because these devices are $N^-N$ junction varactors they have limited tuning range and breakdown voltage. Current GaN vertical varactors are also difficult to integrate with HEMT devices.

An improved vertical varactor is described below. The improved vertical varactor is a P-N junction varactor that can be fabricated with GaN or gallium nitride/aluminum gallium nitride (GaN/AlGaN) material. As described below, the P-N junction varactor can be integrated with HEMT devices in a single device or die. The varactor and HEMT are fabricated with the same materials forming various layers of the varactor and HEMT. The layers of the varactor and HEMT can be coplanar, for example the individual layers can be formed as a single layer and then the layer separated into two portions, for example by cutting or etching away a portion of the layer. In another example, coplanar layers can be formed at the same time with a mask, or other aspect, used to separate the two layers. In still another example, coplanar layers can be formed individually and a polishing technique, or other technique, can make the layers coplanar. As described further below, using the same material stack-up to form the varactor and HEMT can reduce the number of processing steps during the fabrication of the integrated varactor and HEMT device. The integrated varactor and HEMT device may be used for RF circuits, such as RFFE devices for use in 5G. In the following description, when a substance has been lightly doped with an N dopant the chemical compound is proceeded with a $N^-$ and when a substance has been heavily doped with a N dopant the chemical compound is preceded with the notation $N^+$. Likewise, when a substance has been lightly doped with an P dopant the chemical compound is proceeded with a $P^-$ and when a substance has been heavily doped with a P dopant the chemical compound is preceded with the notation $P^+$.

In an aspect, an integrated circuit includes a varactor and a high electron mobility transistor (HEMT). The varactor and HEMT are fabricated with similar coplanar material layers formed in the integrated circuit.

FIG. 1 is a diagram illustrating a vertical P-N junction varactor 102 integrated with a HEMT 104 in the same device 100. As shown in FIG. 1, the device 100 can be an integrated circuit (IC) die. The device 100 includes a substrate 110. The substrate 110 can be silicon (Si), Silicon Carbon (SiC), Aluminum Oxide ($Al_2O_3$), or other material. A buffer layer 112, such as a GaN or AlN layer, is formed on the substrate 110. A first portion of a $P^+$ GaN layer 114 is formed on the buffer layer 112 in a region where the HEMT 104 will be formed. A second portion of the $P^+$ GaN layer 115 is formed on the buffer layer 112 in a region where the varactor 102 will be formed. A first portion of a $N^-$ GaN 116 layer is formed on the first portion of the $P^+$ GaN layer 114. A second portion of the $N^-$ GaN 117 layer is formed on a portion of the second portion of the $P^+$ GaN layer 115. A first portion of a $N^-$ ALGaN layer 118 is formed on the first portion of the $N^-$ GaN layer 116. A second portion of the $N^-$ ALGaN layer 119 is formed on the second portion of the $N^-$ GaN layer 117.

A trench 120 between the first portion of the $P^+$ GaN layer 114 and the second portion of the $P^+$ GaN layer 115; the first portion of the $N^-$ GaN layer 116 and second portion of the $N^-$ GaN layer 117; and the first portion of the $N^-$ AlGaN layer 118 and second portion of the $N^-$ AlGaN layer; isolate the varactor 102 from the HEMT 104. A dielectric layer 122, such as SiO, SiN, AO, or other type of dielectric material, is formed on the sidewalls and bottom of the trench 120. The dielectric material 122 is also formed on a side of the varactor 102 opposite the trench 120 and on portions of a top surface of the HEMT 104. A first contact 130 of the varactor 102 is coupled to a portion of the second portion of the $P^+$ GaN layer 115 not covered by the second portion of the $N^-$ GaN layer 117, and a second contact 132 of the varactor 102 is coupled to the second portion of the $N^-$ AlGaN layer 119. A source contact 134, drain contact 136, and gate contact 138 extend through the dielectric material 122 on the top of the HEMT 104 to couple to the first portion of the $N^-$ AlGaN layer 118.

As shown in FIG. 1, and described further below, the varactor 102 is integrated in the same device, or die, 100 as the HEMT 104. The varactor 102 and HEMT 104 are fabricated from the same stack up of coplanar material layers. Also, the varactor 102 is a P-N junction varactor offering improved tuning range and breakdown voltage over conventional N⁻N junction vertical varactors.

Figure 2:
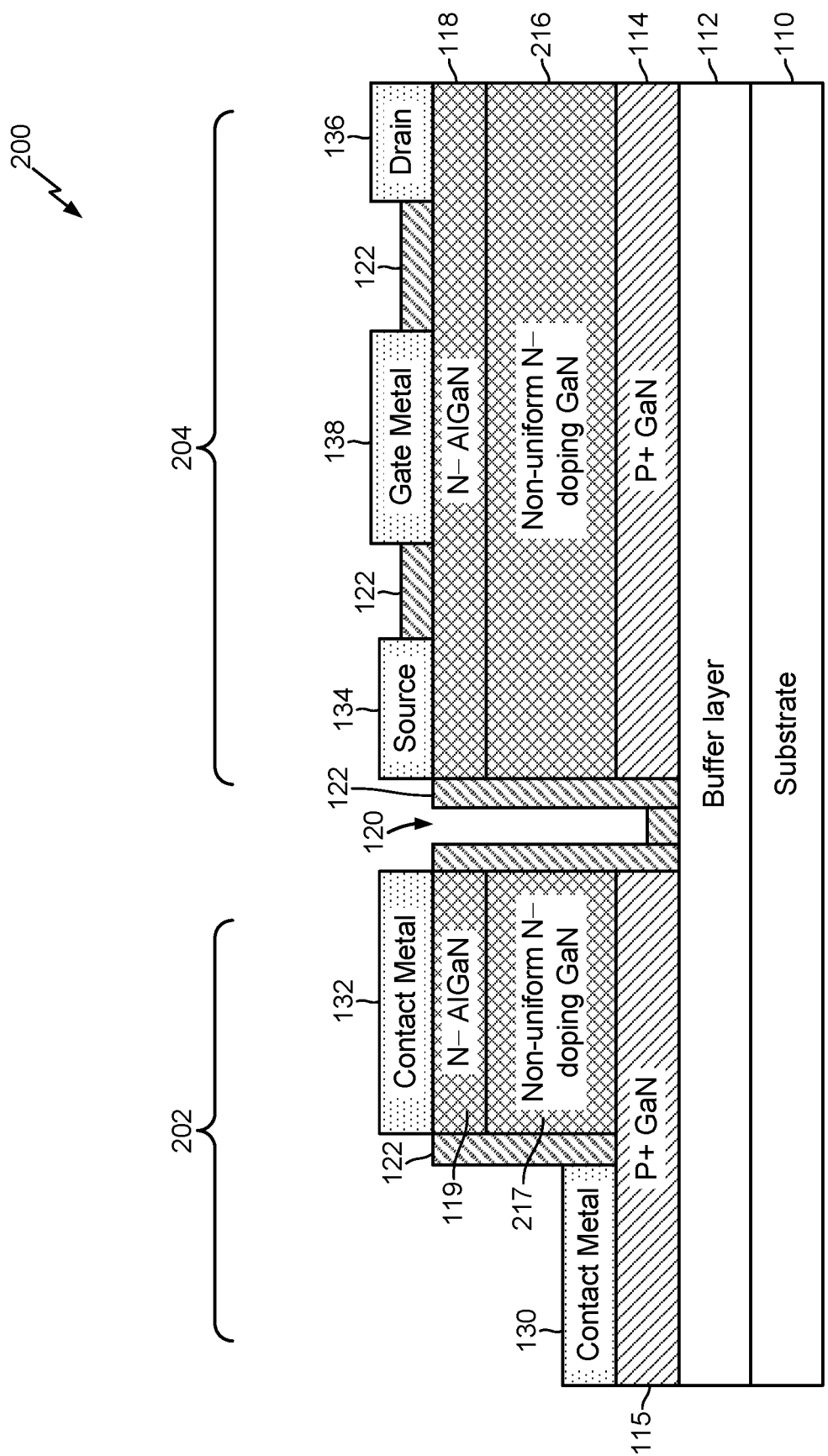
FIG. 2 is a first alternative to a vertical P-N junction varactor integrated with a HEMT.

FIG. 2 is a first alternative of a vertical P-N junction varactor integrated with a HEMT As shown in FIG. 2, the varactor and HEMT can be integrated into an integrated circuit (IC) die 200. The device 200 illustrated in FIG. 2 is similar in structure to the device 100 in FIG. 1 with a first portion of a N⁻ GaN layer 216, and a second portion of the N⁻ GaN layer 217 having non-uniform doping profiles. Non-uniform doping of the first and second N⁻ GaN layers 216 and 217 can be used to tune characteristics of the varactor 202 and HEMT 204. For example, the varactor 204 and HEMT 204 can be tuned for higher breakdown voltage, lower leakage current, increased tuning range, and various other characteristics of the varactor 202 and HEMT 204.

Figure 3:
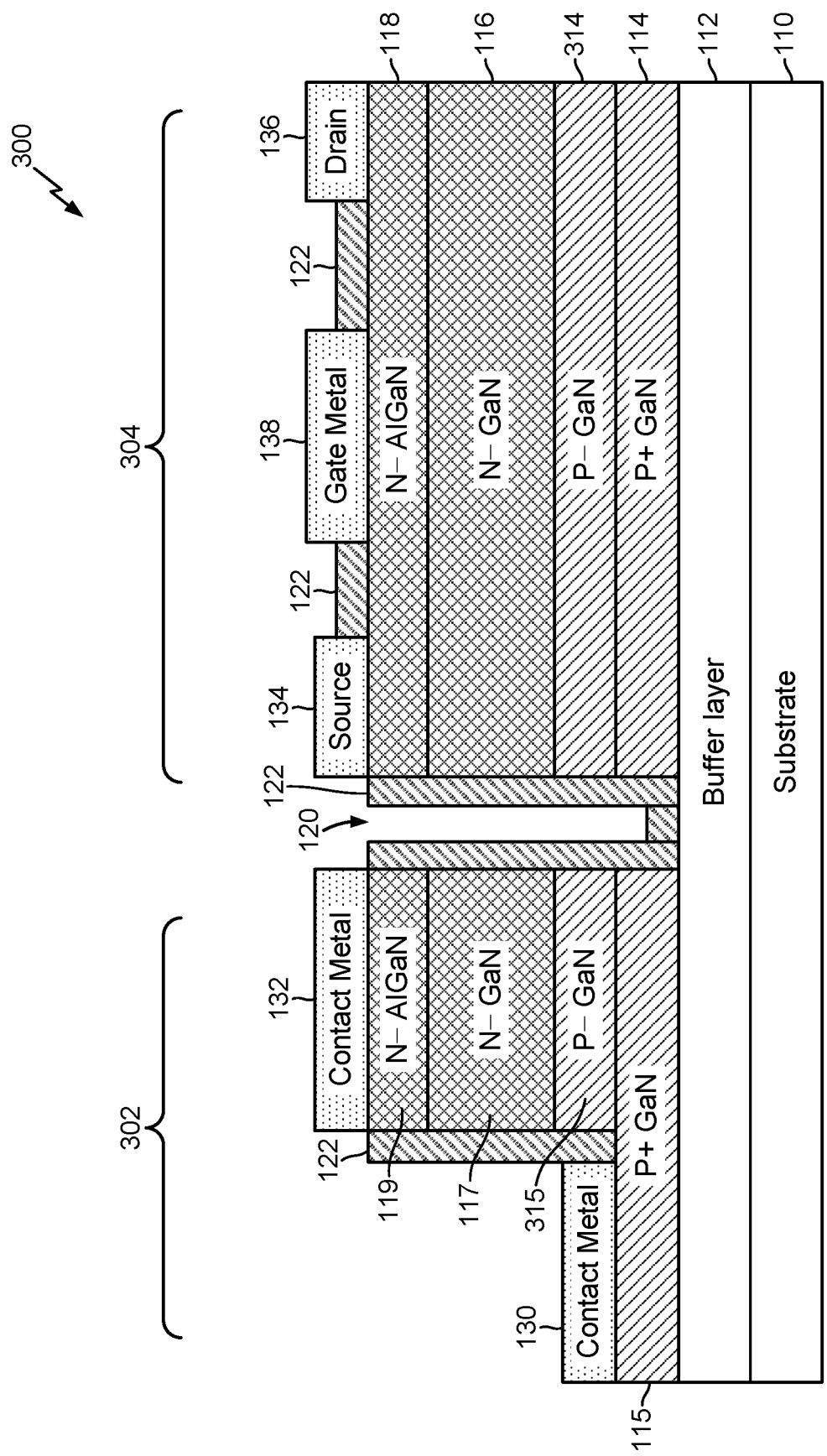
FIG. 3 is a second alternative to a vertical P-N junction varactor integrated with a HEMT.

FIG. 3 is a second alternative of a vertical P-N junction varactor integrated with a HEMT. As shown in FIG. 3, the varactor and HEMT can be integrated into an integrated circuit (IC) die 300. The device 300 illustrated in FIG. 3 is similar in structure to the device 100 in FIG. 1 with a first portion of a P⁻ GaN layer 314 formed between the first portion of the P⁺ GaN layer 114 and the first portion of the N⁻ GaN layer 116; and a second portion of the P⁻ GaN layer 315 formed between the second portion of the P⁺ GaN layer 115 and second portion of the N⁻ GaN layer 117. Addition of the first and second portions of the P⁻ GaN layers 314 and 314 can adjust the characteristics of the varactor 302 and HEMT 304. For example, addition of the first and second portions of the P⁻ GaN layers 314 and 315 can increase the depletion region of the varactor, provide higher breakdown voltage, lower leakage current, and increase tuning range for the HEMT 304.

Figure 4:
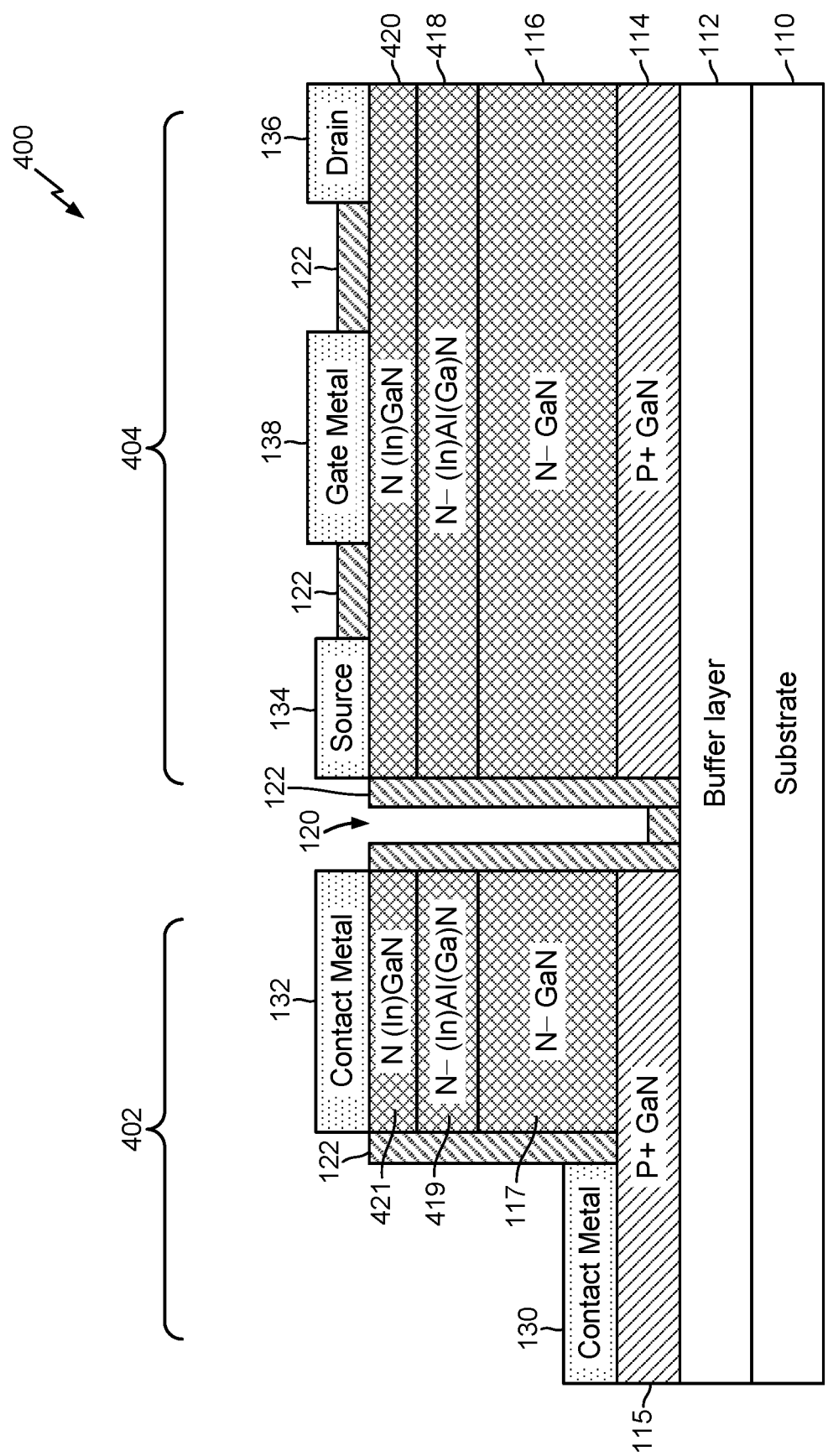
FIG. 4 is a third alternative to a vertical P-N junction varactor integrated with a HEMT.

FIG. 4 is a third alternative to a vertical P-N junction varactor integrated with a HEMT. As shown in FIG. 4, the varactor and HEMT can be integrated into an integrated circuit (IC) die 400. The device 400 illustrated in FIG. 4 is similar in structure to the device 100 in FIG. 1 with the first portion of the N⁻ AlGaN layer 118 replaced with a first portion of a N⁻ (In)Al(Ga)N layer 418 formed on the first portion of the N⁻ GaN layer 116 and a first portion of a N indium gallium nitride ((In)GaN) layer 420 formed on the first portion of the N⁻ (In)GaN layer 418. In addition, the second portion of the N⁻ AlGaN layer 119 is replaced with a second portion of the N⁻ (In)Al(Ga)N layer 419 formed on the second portion of the N⁻ GaN layer 117 and a second portion of the N (In)GaN layer 421 formed on the second portion of the N⁻ (In)GaN layer 419. It is noted that when an element is listed in parenthesis, ( ) in a chemical formula, it indicates that the amount of that element in the compound can be varied, or the element can be removed, and still be within the scope of the present disclosure.

Addition of the first and second portions of the N⁻ (In)Al(Ga)N layers 418 and 419; and the first and second portions of the N (In)GaN layers 420 and 421 can adjust characteristics of the varactor 402 and HEMT 404. For example, there can be variation in the bandgap of the HEMT 404 device improving the RF bandwidth performance. In addition, the thickness and composition of various layers may be varied to optimize performance of both the varactor and transistor.

Figure 5:
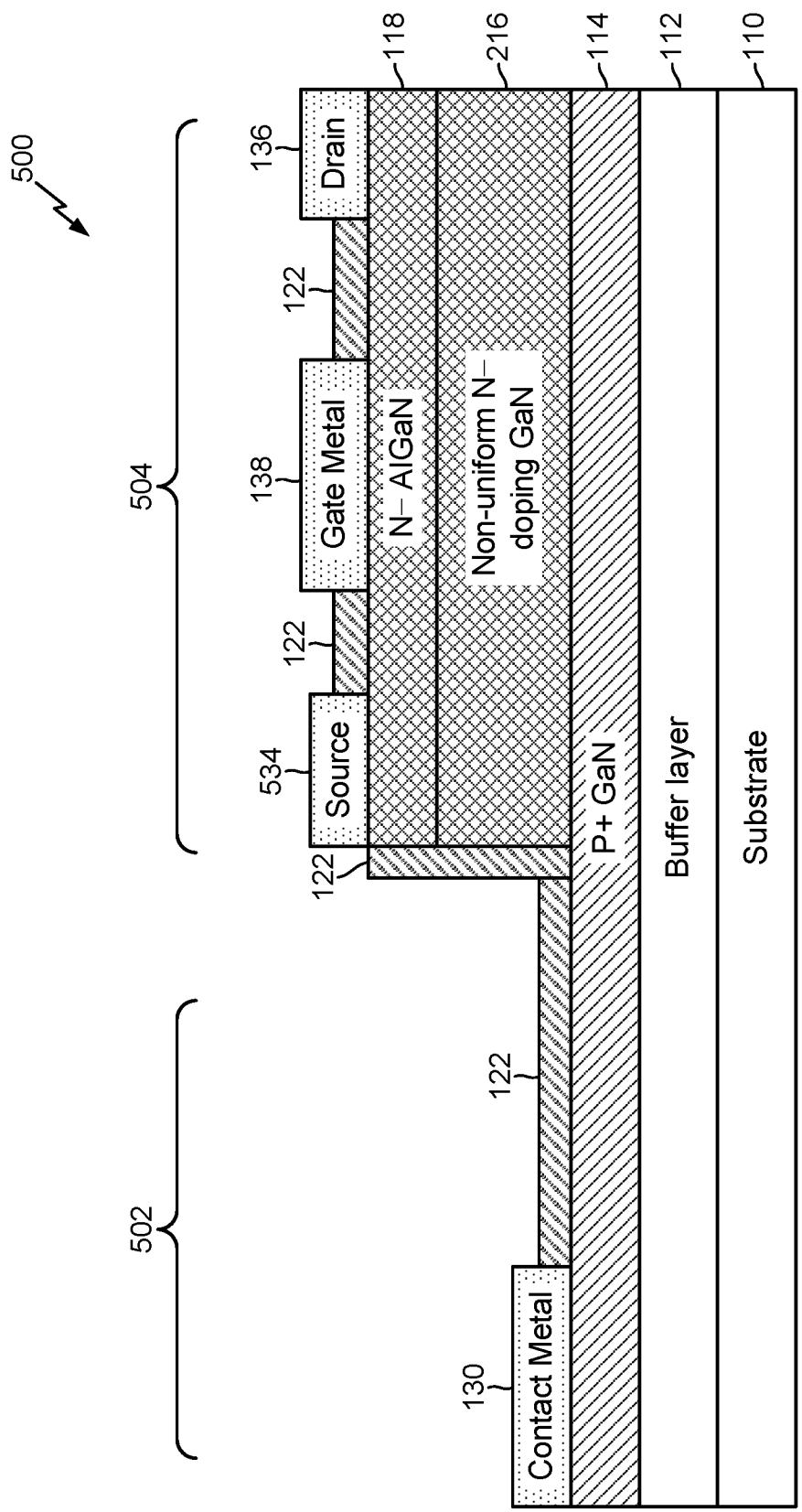
FIG. 5 is a fourth alternative to a vertical P-N junction varactor integrated with a HEMT.

FIG. 5 is a fourth alternative of a vertical P-N junction varactor integrated with a HEMT. As shown in FIG. 5, the varactor and HEMT can be integrated into an integrated circuit (IC) die 500. The device 500 illustrated in FIG. 5 is similar in structure to the device 200 in FIG. 2 with the trench 120, the second portion of the non-uniformly doped N⁻ GaN layer 217, and the second portion of the N⁻ AlGaN layer 119 removed. The first portion of the P⁺ GaN layer 114 extends over the buffer layer 112 covering both the region where the HEMT 504 will be formed and the region where the varactor 502 will be formed. The dielectric layer 122 extends over the first portion of the P⁺ GaN layer 114 from the dielectric layer 122 on the side of the HEMT device 504 to the first metal contact 130. In this alternative, the varactor 502 and HEMT 504 share the first portion of the P⁺ GaN layer 114, the first portion of the non-uniformly doped N⁻ GaN layer 216, the first portion of the N⁻ AlGaN layer 118, and the source contact 534. The alternative of FIG. 5 reduces the number of contacts and can reduce the area of the integrated device 500.

FIGS. 6A-6G illustrate a series of exemplary operations for fabricating an integrated varactor and HEMT device according to at least one aspect of the disclosure. The example illustrated in FIGS. 6A-6G illustrate exemplary operation for fabricating the integrated varactor HEMT device 100 of FIG. 1.

Figure 6A:
FIGS. 6A-6G illustrate a series of exemplary operations for fabricating an integrated varactor and HEMT device according to at least one aspect of the disclosure.

In the fabrication operation illustrated in FIG. 6A, a substrate 110 is formed. The substrate can be, for example, a silicon (Si), Silicon Carbon (SiC), Aluminum Oxide (Al₂O₃), or other material. A buffer layer 112, such as a GaN/AlN layer, is formed on the substrate 110.

Figure 6B:
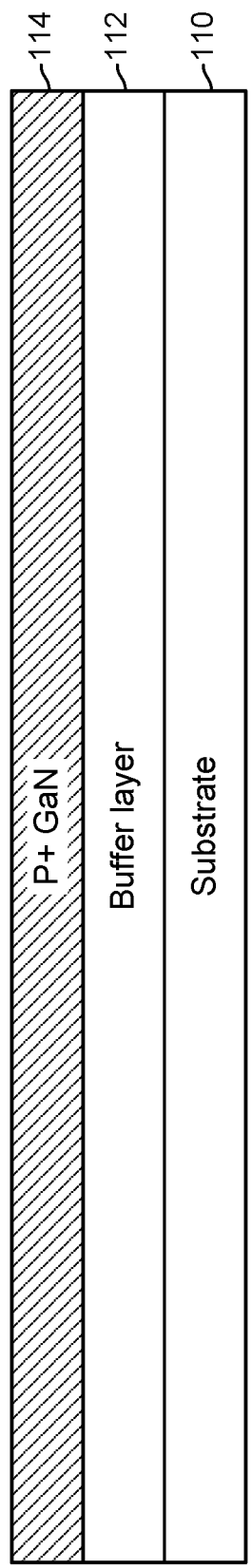
Figure 6C:
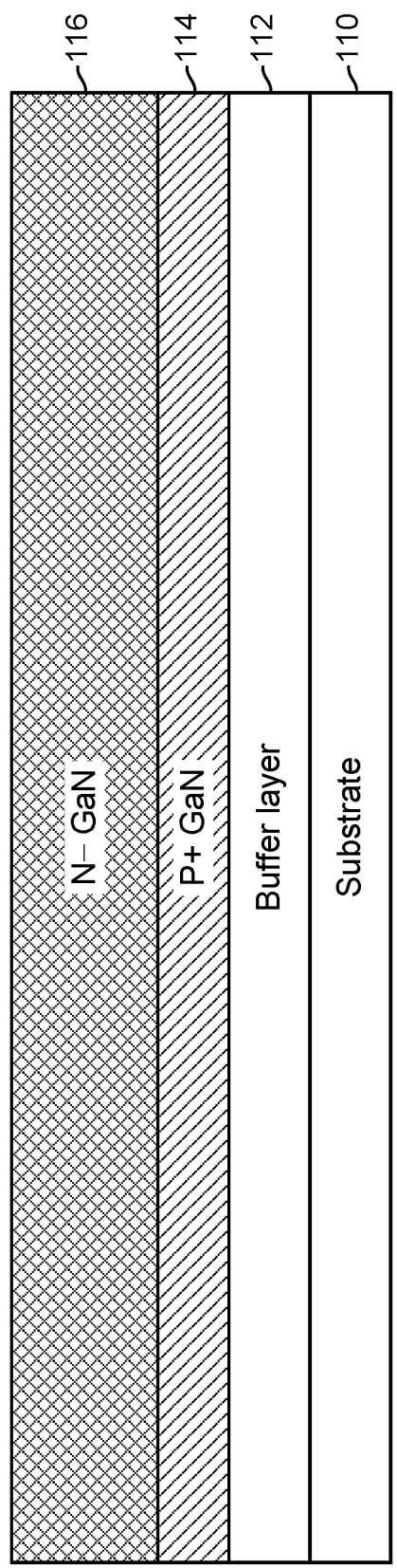
Figure 6D:
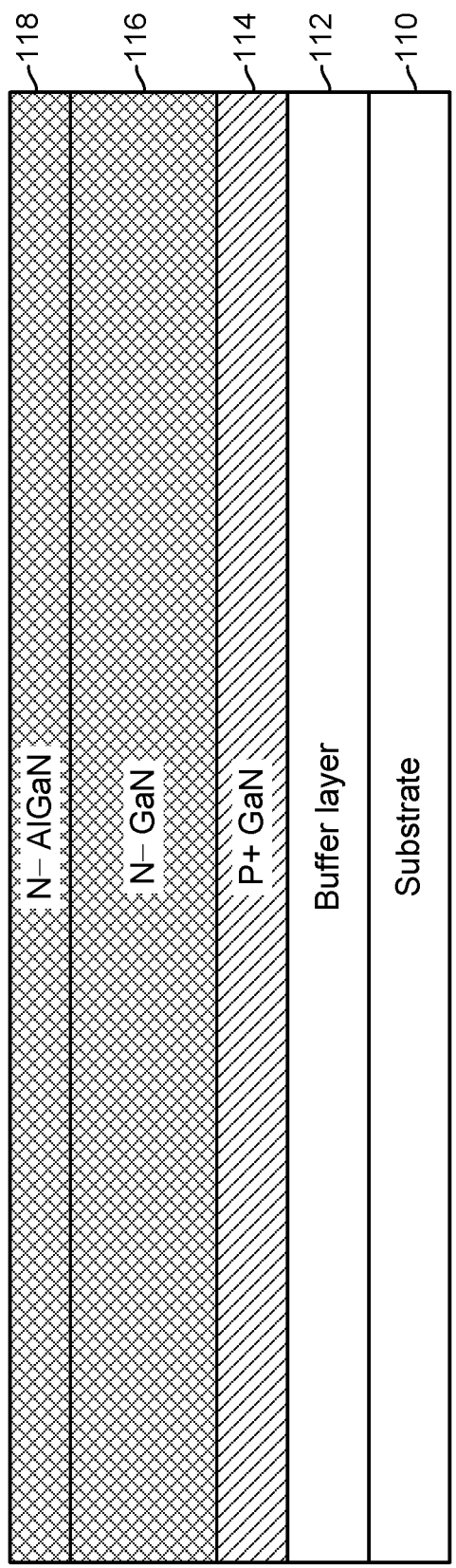

In the fabrication operation illustrated in FIG. 6B, a P⁺ GaN layer is formed on the buffer layer 112. In the fabrication operation illustrated in FIG. 6C an N⁻ GaN layer 116 is formed on the P⁺ GaN layer 114. In the fabrication process in FIG. 6D an N⁻ AlGaN layer 118 is formed on the N⁻ GaN layer 116.

Figure 6E:
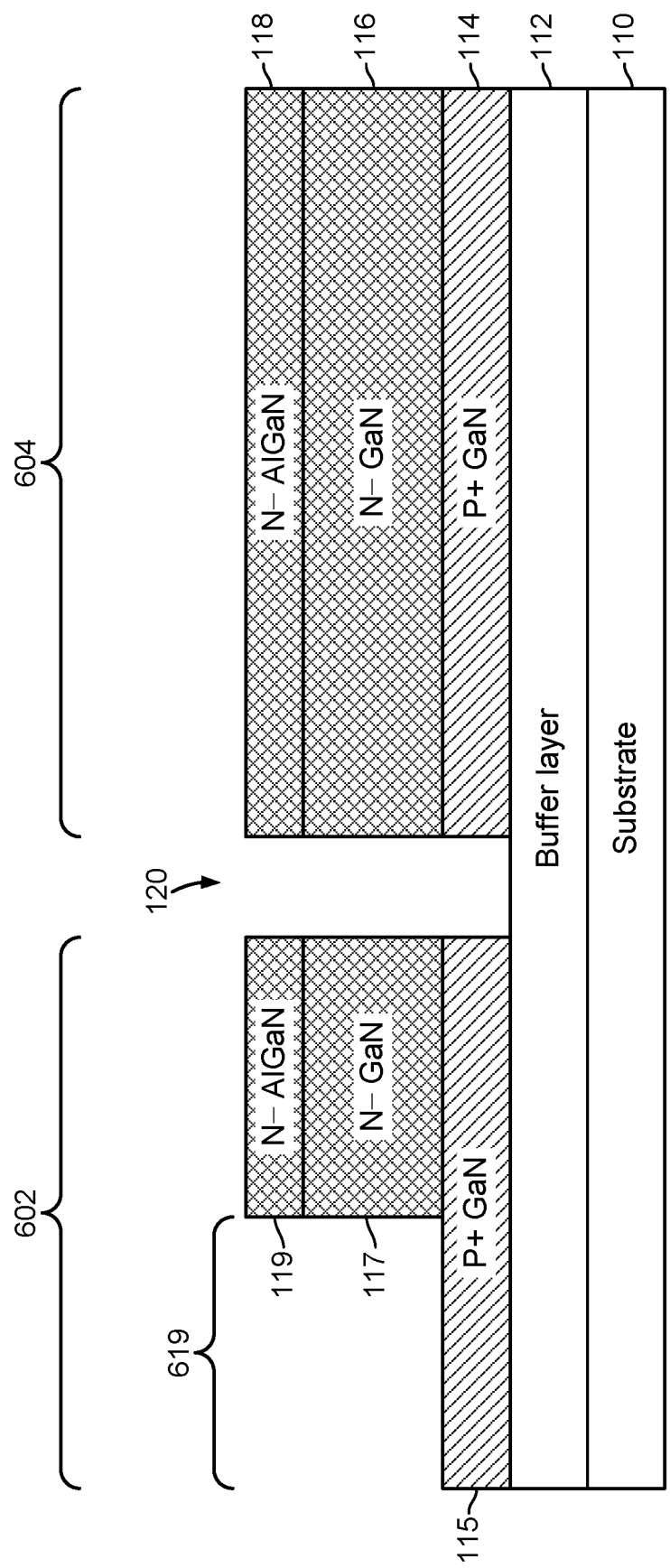

In the fabrication operation illustrated in FIG. 6E, a trench 120 is formed by removing a portion of the N⁻ AlGaN layer 118 thereby forming a first N⁻ AlGaN layer 118 and a second N⁻ AlGaN layer 119 that are co-planar with each other and electrically isolated from each other. The trench 120 also removes a portion of the N⁻ GaN layer 116 thereby forming a first N⁻ GaN layer 116 and a second N⁻ GaN layer 117 that are co-planar with each other and electrically isolated from each other. In addition, the trench 120 removes a portion of the P⁺ GaN layer 114 thereby forming a first P⁺ GaN layer 114 and a second P⁺ GaN layer 115 that are co-planar with each other and electrically isolated from each other The trench 120 forms a first region 604 where the HEMT 104 will be formed and a second region 602 where the varactor 102 will be formed. In the second region 602 a portion 619 of the second N⁻ AlGaN layer 119 and the second N⁻ GaN layer 117 are removed exposing a portion of the second P⁺ GaN layer 115. The portions of the various layers can be removed by various techniques, such as by etching, laser ablation, drilling, etc.

Figure 6F:
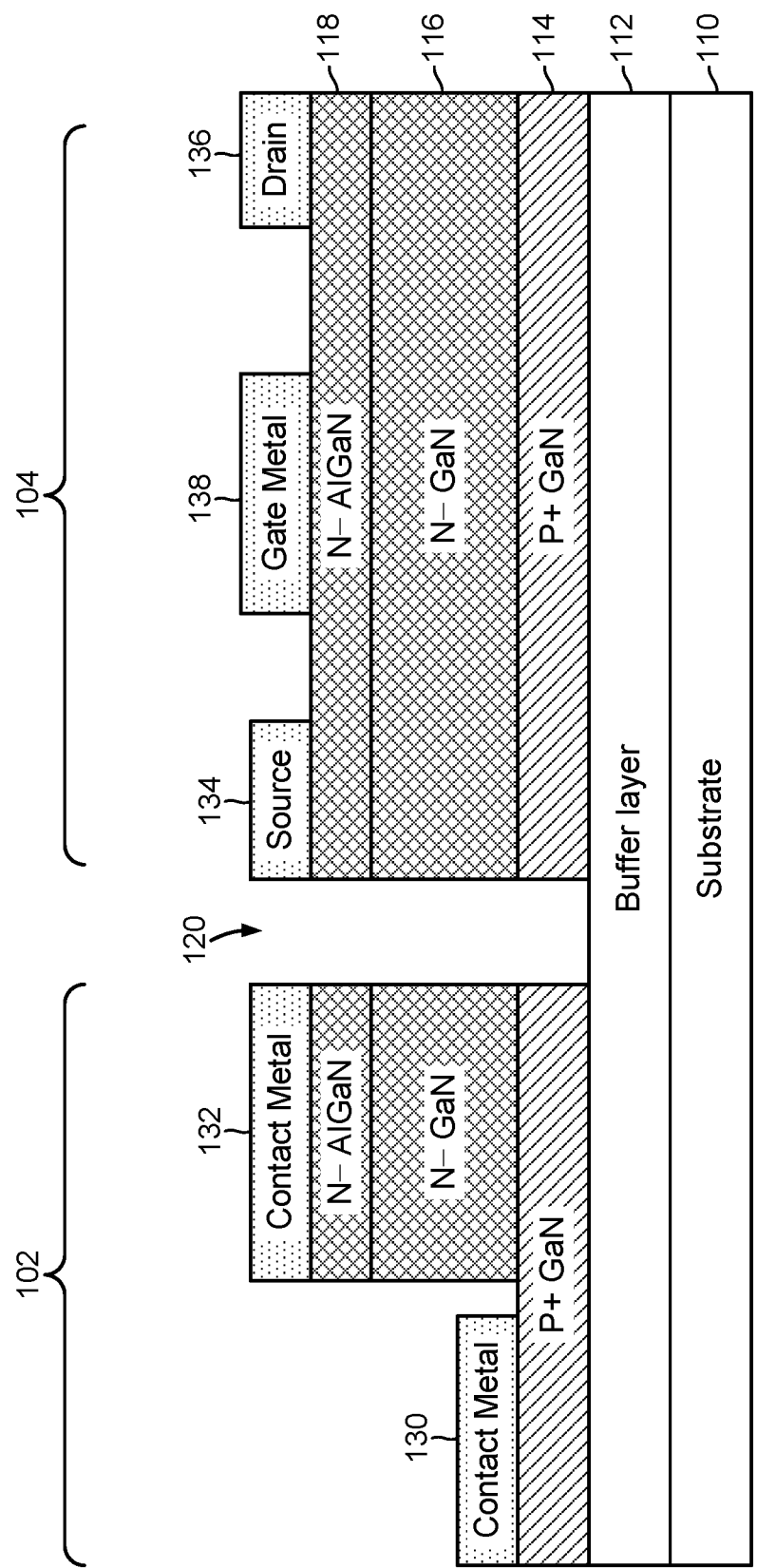

In the fabrication operation illustrated in FIG. 6F a first contact 130 if formed on a portion of the second P⁺ GaN layer 115, the first contact 130 does not contact other layers. A second contact 132 is formed on the second N⁻ AlGaN layer 119, thereby forming the varactor 102. The first contact 130 forms the P contact and the second contact 132 forms the N contact for the P-N varactor 102. A source contact 134, a drain contact 136, and a gate contact 138 between the source contact 134 and drain contact 136, are formed on the first N⁻ AlGaN 118, thereby forming the HEMT 104.

Figure 6G:
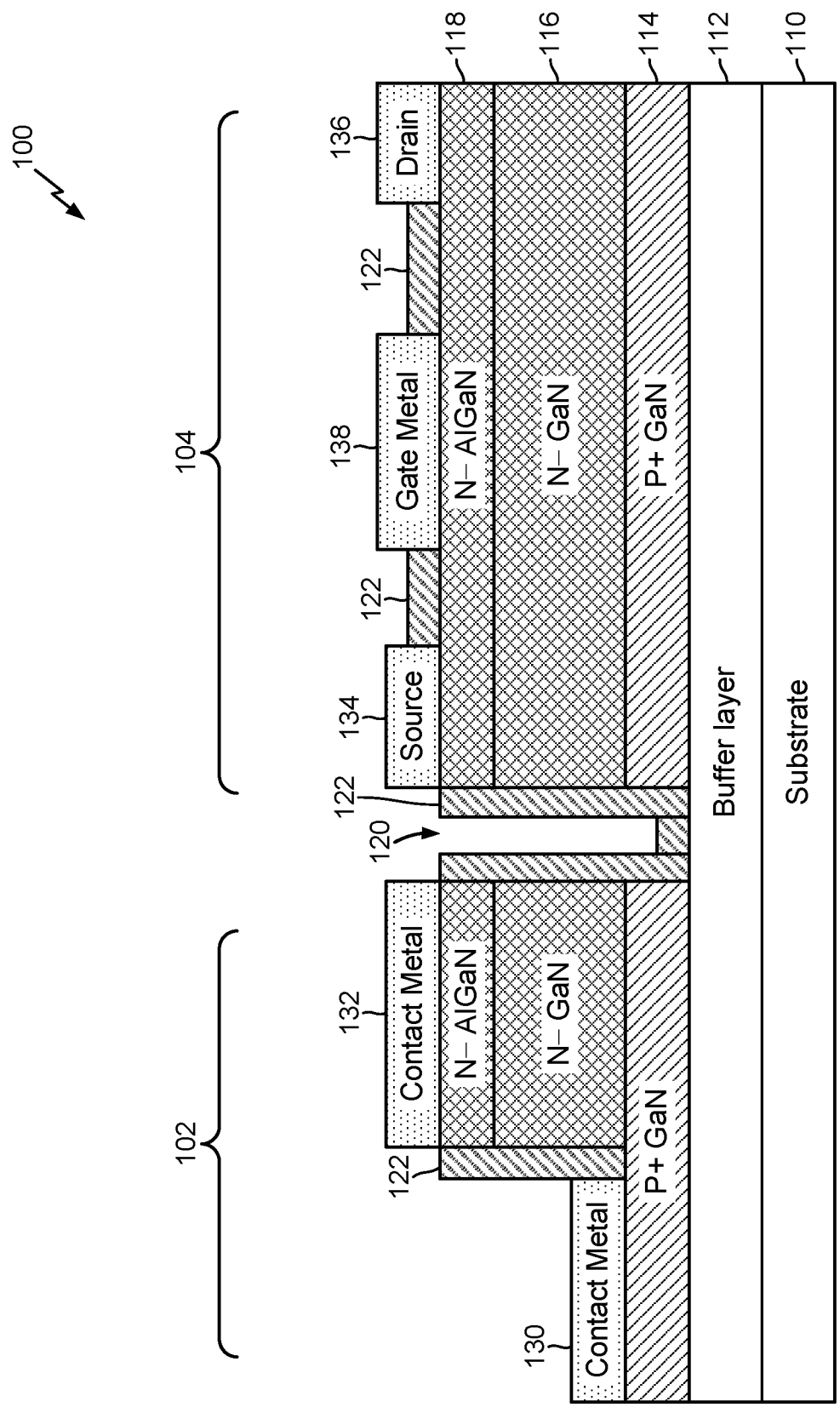

In the fabrication operation illustrated in FIG. 6G a dielectric layer 122 is formed over exposed portions of the varactor 102 and HEMT 104, leaving the first, second, source, drain, and gate contacts 130, 132, 134, 136, and 138 exposed. The dielectric layer helps to protect the integrated varactor HEMT device 100.

As illustrated in FIGS. 6A-6G, the varactor 102 and HEMT 104 are fabricated from the same layer stack up which can simplify fabrication. While the example illustrated in FIGS. 6A-6G only illustrate a varactor 102 and HEMT 104 devices, other devices can also be integrated in the device 100.

The example integrated varactor HEMT devices illustrated in FIGS. 2-5 can be fabricated in a similar process as shown in FIGS. 6A-G. Additionally, the operations in FIGS. 6A-G can be performed in different order. For example, the dielectric layer 122 in FIG. 6G can be formed before the contacts in FIG. 6F are formed. In this example, after the dielectric layer 122 is formed, openings can be made in the dielectric layer 122, for example by etching, and then contacts are formed in the openings in the dielectric.

Figure 7:
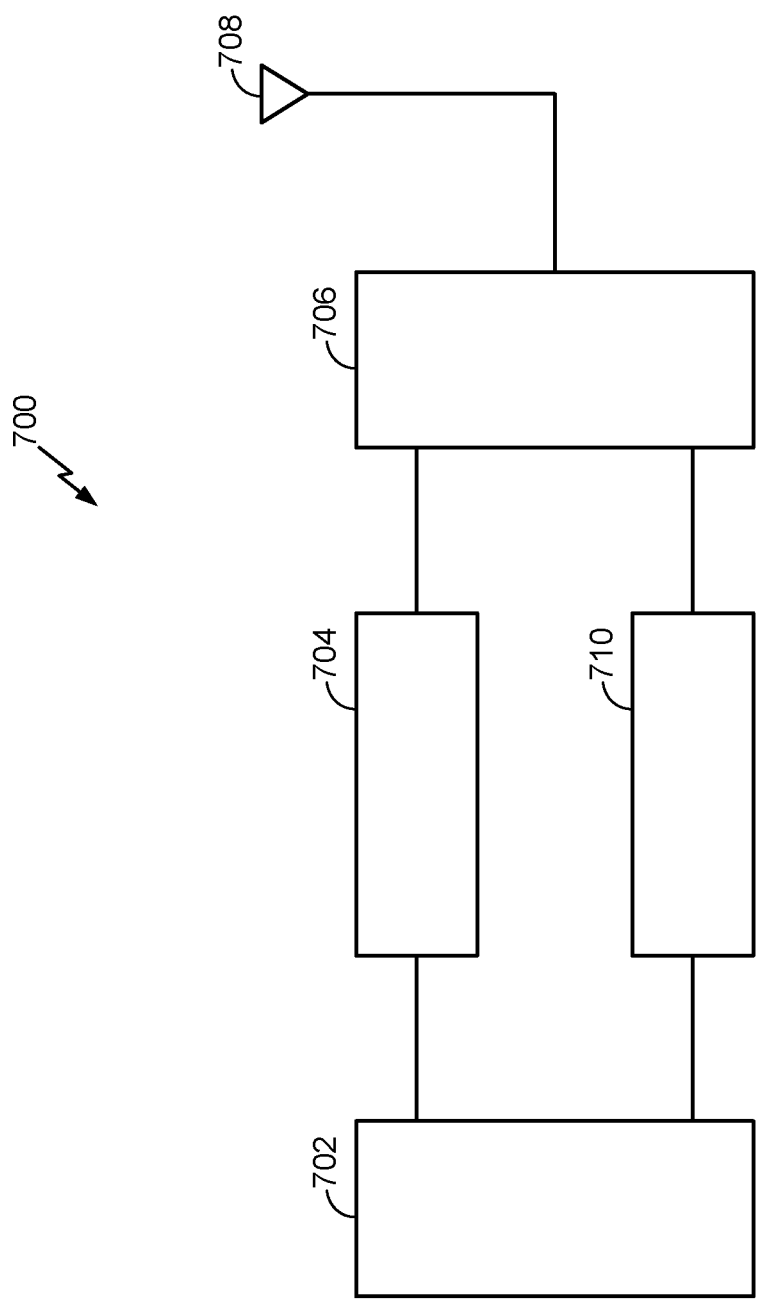
FIG. 7 illustrates an RF module that may include a varactor integrated with a HEMT.

FIG. 7 illustrates an RF module 700 that may include the integrated varactor and HEMT devices described above. The RF module may be used to transmit and/or receive RF signals, such as 5G RF signals. The RF module 700 includes a transceiver 702 coupled to a power amplifier 704. The power amplifier 704 is coupled to a duplexer 706 that is coupled to an antenna 708. The RF module 700 also includes receive circuitry 710 that is coupled to the duplexer 706 and the transceiver 702. For clarity, other components of the RFR module 700 are not shown.

When the RF module 700 is used to transmit data, the transceiver 702 receives a data signal and creates an RF signal which is amplifier by the power amplifier 704 to a desired power level for transmission. The power amplifier 704 output is coupled to the duplexer 706 that routs the power amplifier output to the antenna 708 for transmission. The power amplifier 704 may include an integrated HEMT and varactor device as described above. The HEMT can be used to amplify the RF signal and the varactor can be used to optimize matching circuitry to efficiently couple the power amplifier to the duplexer 706 antenna 708 combined load seen by the power amplifier 704.

When the RF module 700 is used to receive data, an RF signal from the antenna 708 is coupled through the duplexer 706 to the receive circuitry 710. An output of the receive circuitry 710 is coupled to the transceiver 702. The receive circuitry 710 may include an integrated HEMT and varactor device as described above. The varactor can be used to efficiently couple the receive circuit 710 to the duplexer 706 antenna 710 combination. A varactor may also tune the receive circuitry 710 to a desired frequency band. Also, the HEMT may amplify the received RF signal before the signal is sent to the transceiver 702.

Figure 8:
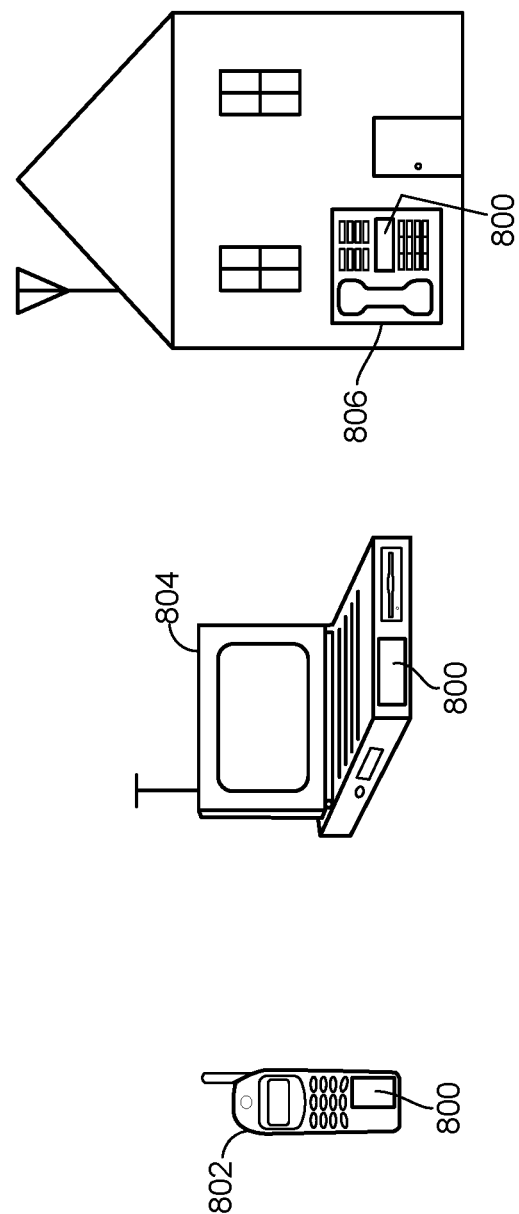
FIG. 8 illustrates various electronic devices that may include a varactor integrated with a HEMT.

FIG. 8 illustrates various electronic devices that may include a varactor integrated with a HEMT, such as the RF module 700, described above. For example, a mobile phone device 802, a laptop computer device 804, a terminal device 806 as well as wearable devices, portable systems, that require small form factor, extreme low profile, may include an apparatus 800 that incorporates the devices/systems as described herein. The apparatus 800 may be, for example, any of the integrated circuits, dies, integrated devices, integrated device packages, integrated circuit devices, device packages, integrated circuit (IC) packages, package-on-package devices, system-in-package devices described herein. The devices 802, 804, 806 illustrated in FIG. 8 are merely exemplary. Other electronic devices may also feature the apparatus 800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

While the above describes a single HEMT and varactor integrated in a single device of die, in other aspects there can be multiple HEMTs and varactors, and different numbers of, HEMTs and varactors integrated in a single device or die. In addition, other compounds may be integrated onto the same device or die with the HEMT and varactor.

The various illustrative logical blocks, modules, and circuits described in connection with the aspects disclosed herein may be implemented or performed in an integrated circuit (IC), a system on a chip (SoC), an Application Specific Integrated Circuit (ASIC), or any combination thereof designed to perform the functions described herein.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in flow chart diagrams may be subject to numerous different modifications as will be readily apparent to one of skill in the art The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An integrated circuit comprising:
   a substrate;
   a buffer layer on the substrate;
   a varactor on a first portion of the buffer layer, the varactor comprising:
      a first gallium nitride (GaN) layer doped with a P-type dopant ($P^+$ GaN layer) on the first portion of the buffer layer;
      a first stack of layers on the first $P^+$ GaN layer, the first stack of layers comprising:
         a first varactor layer comprising a first material comprising a GaN compound, the first material doped to a first concentration of N-type dopant; and
         a second varactor layer comprising a second material comprising a GaN compound, the second material doped to a second concentration of the N-type dopant;
      a first contact coupled to a portion of the first $P^+$ GaN layer, the first contact electrically isolated from the first stack of layers; and
      a second contact coupled to the second varactor layer; and
   a high electron mobility transistor (HEMT) comprising:

a second P+ GaN layer on a second portion of the buffer layer electrically isolated from the first P+ GaN layer;
a second stack of layers on the second P+ GaN layer, the second stack of layers comprising:
  a first HEMT layer comprising the first material doped to the first concentration of the N-type dopant; and
  a second HEMT layer comprising the second material doped to the second concentration of the N-type dopant;
a third contact coupled to a first portion of the second HEMT layer;
a fourth contact coupled to a second portion of the second HEMT layer; and
a fifth contact coupled to a third portion of the second HEMT layer, the fourth contact located between the third and fifth contacts, the third, fourth, and fifth contacts electrically isolated from each other.

2. The integrated circuit of claim 1, wherein:
the first varactor layer comprises a GaN layer doped with the N-type dopant (N− GaN layer), and the first varactor layer is electrically isolated from the first HEMT layer; and
the second varactor layer comprises an aluminum gallium nitride layer doped with the N-type dopant (N− AlGaN layer), and the second varactor layer is electrically isolated from the second HEMT layer.

3. The integrated circuit of claim 2, wherein the first varactor layer and the first HEMT layer have non-uniform doping profiles.

4. The integrated circuit of claim 2, further comprising:
another GaN layer doped with the P-type dopant (first P− GaN layer) between the first P+ GaN layer and the first varactor layer; and
a second P− GaN layer between the second P+ GaN layer and the first HEMT layer.

5. The integrated circuit of claim 2, further comprising:
a first indium gallium nitride layer doped with the N-type dopant (N InGaN layer) between the second varactor layer and the second contact; and
a second N InGaN layer between the second HEMT layer and the third, fourth, and fifth contacts.

6. The integrated circuit of claim 5, wherein the second varactor layer and the second HEMT layer further comprise indium (In).

7. The integrated circuit of claim 1, wherein:
the first varactor layer comprises a GaN layer doped with the N-type dopant (N− GaN layer), having a non-uniform doping profile, on a portion of the first P+ GaN layer; and
the second varactor layer comprises an aluminum gallium nitride layer doped with the N-type dopant (N− AlGaN layer) on the first varactor layer.

8. An integrated circuit comprising:
a varactor comprising;
  a P+ GaN layer;
  a N− GaN layer on the P+ GaN layer;
  a N− AlGaN layer on the P+ GaN layer;
  a first contact coupled to the P+ GaN layer; and
  a second contact coupled to the N− AlGaN layer; and
a high electron mobility transistor (HEMT) comprising;
  a P+ GaN layer coplanar with the P+ GaN layer of the varactor;
  an N− GaN layer on the P+ GaN layer, the N− GaN layer coplanar with the N− GaN layer of the varactor;
  a N− AlGaN layer on the P+ GaN layer, the N− AlGaN layer coplanar with the N− AlGaN layer of the varactor; and
  a third contact, a fourth contact, and a fifth contact coupled to the N− AlGaN layer, the third, fourth, and fifth contacts electrically isolated from each other and the fourth contact between the third and fifth contacts.

9. The integrated circuit of claim 8, wherein the N− GaN layers have non-uniform doping profiles.

10. The integrated circuit of claim 8, further comprising:
the varactor comprising a P− GaN layer between the P+ GaN layer and the N− GaN layer; and
the HEMT comprising a P− GaN layer between the P+ GaN layer and the N− GaN layer;
wherein the P− GaN layer of the varactor and the P− GaN layer of the HEMT are co-planar.

11. The integrated circuit of claim 8, further comprising:
the HEMT comprising an N InGaN layer between the N− AlGaN layer and the third, fourth, and fifth contacts; and
the varactor comprising an N InGaN layer between the N− AlGaN layer and the second contact;
wherein the N InGaN layer of the HEMT and the N InGaN layer of the varactor are co-planar.

12. A radio frequency (RF) module comprising:
a single die comprising a substrate;
a buffer layer on the substrate;
a varactor on a first portion of the buffer layer, the varactor comprising:
  a first gallium nitride (GaN) layer doped with a P-type dopant (P+ GaN layer) on the first portion of the buffer layer; and
  a first stack of layers on the first P+ GaN layer, the first stack of layers comprising:
    a first varactor layer comprising a first material comprising a GaN compound, the first material doped to a first concentration of N-type dopant; and
    a second varactor layer comprising a second material comprising a GaN compound, the second material doped to a second concentration of the N-type dopant;
  a first contact coupled to a portion of the first P+ GaN layer, the first contact electrically isolated from the first stack of layers; and
  a second contact coupled to the second varactor layer; and
a high electron mobility transistor (HEMT) comprising:
  a second P+ GaN layer on a second portion of the buffer layer; and
  a second stack of layers on the second P+ GaN layer, the second stack of layers comprising:
    a first HEMT layer comprising the first material doped to the first concentration of the N-type dopant; and
    a second HEMT layer comprising the second material doped to the second concentration of the N-type dopant;
  a third contact coupled to a first portion of the second HEMT layer;
  a fourth contact coupled to a second portion of the second HEMT layer; and
  a fifth contact coupled to a third portion of the second HEMT layer, the fourth contact located between the third and fifth contacts, the third, fourth, and fifth contacts electrically isolated from each other, wherein:
the HEMT is configured to receive an RF signal and output an amplified RF signal; and
the varactor is configured to couple the amplified RF signal to a load.

13. The RF module of claim 12, wherein:
the first varactor layer comprises a GaN layer doped with the N-type dopant (N⁻ GaN layer), and the first varactor layer is electrically isolated from the first HEMT layer; and
the second varactor layer comprises an aluminum gallium nitride layer doped with the N-type dopant (N⁻ AlGaN layer), and the second varactor layer is electrically isolated from the second HEMT layer.

14. The RF module of claim 13, wherein the first varactor layer and the first HEMT layer have non-uniform doping profiles.

15. The RF module of claim 13, further comprising:
another GaN layer doped with the P-type dopant (first P⁻ GaN layer) between the first P⁺ GaN layer and the first varactor layer; and
a second P⁻ GaN layer between the second P⁺ GaN layer and the first HEMT layer.

16. The RF module of claim 13, further comprising:
a first indium gallium nitride layer doped with the N-type dopant (N InGaN layer) between the second varactor layer and the second contact; and
a second N InGaN layer between the second HEMT layer and the third, fourth, and fifth contacts.

17. The RF module of claim 16, wherein the second varactor layer and the second HEMT layer further comprise indium (In).

18. The RF module of claim 12, wherein:
the first varactor layer comprises a GaN layer doped with the N-type dopant (N⁻ GaN layer), having a non-uniform doping profile, on a portion of the first P⁺ GaN layer; and
the second varactor layer comprises an aluminum gallium nitride layer doped with the N-type dopant (N⁻ AlGaN layer) on the first varactor layer.

19. The RF module of claim 12, wherein the RF signal is a 5G RF signal.

20. The RF module of claim 12, wherein the HEMT is included in an RF power amplifier.

21. A method of manufacturing a device with a varactor integrated with a high electron mobility transistor (HEMT), the method comprising:
forming a substrate;
forming a buffer layer on the substrate;
forming a first P⁺ GaN layer on a first portion of the buffer layer and forming a second P⁺ GaN layer on a second portion of the buffer layer, the first P⁺ GaN layer electrically isolated from the second P⁺ GaN layer;
forming a first N⁻ GaN layer on a portion of the first P⁺ GaN layer and forming a second N⁻ GaN layer on the second P⁺ GaN layer, the first N⁻ GaN layer electrically isolated from the second N⁻ GaN layer;
forming a first N⁻ AlGaN layer on the first N⁻ GaN layer and forming a second N⁻ AlGaN layer on the second N⁻ GaN layer, the first N⁻ AlGaN layer electrically isolated from the second N⁻ AlGaN layer; and
forming a first contact coupled to a portion of the first P⁺ GaN layer, the first contact electrically isolated from the first N⁻ GaN layer, forming a second contact coupled to the first N⁻ AlGaN layer, forming a third contact coupled to a first portion of the second N⁻ AlGaN layer, forming a fourth contact coupled to a second portion of the second N⁻ AlGaN layer, and forming a fifth contact coupled to a third portion of the second N⁻ AlGaN layer, the fourth contact located between the third and fifth contacts, the third, fourth, and fifth contacts electrically isolated from each other.

22. The method of claim 21, wherein the first N⁻ GaN layer and the second N⁻ GaN layer have non-uniform doping profiles.

23. The method of claim 21, further comprising:
forming a first P⁺ GaN layer between the first P⁺ GaN layer and the first N⁻ GaN layer; and
forming a second P⁻ GaN layer between the second P⁺ GaN layer and the second N⁻ GaN layer.

24. The method of claim 21, further comprising:
forming a second N InGaN layer between the second N⁻ AlGaN layer and the third, fourth, and fifth contacts; and
forming a first N InGaN layer between the first N⁻ AlGaN layer and the second contact.

25. A method of manufacturing a device with a varactor integrated with a high electron mobility transistor (HEMT), the method comprising:
forming a substrate;
forming a buffer layer on the substrate;
forming a P⁺ GaN layer on the buffer layer;
forming an N⁻ GaN layer, having a non-uniform doping profile, on a portion of the P⁺ GaN layer;
forming an N⁻ AlGaN layer on the N⁻ GaN layer; and
forming a first contact coupled to a portion of the P⁺ GaN layer, the first contact electrically isolated from the N⁻ GaN layer, forming a second contact coupled to a first portion of the N⁻ AlGaN layer, forming a third contact coupled to a second portion of the N⁻ AlGaN layer, and forming a fourth contact coupled to a third portion of the N⁻ AlGaN layer, the fourth contact located between the second and third contacts, the second, third, and fourth contacts electrically isolated from each other.

* * * * *